(12) United States Patent
Kowalski (10) Patent No.: US 12,018,374 B2
(45) Date of Patent: Jun. 25, 2024

(54) SYSTEM AND METHOD OF LOW TEMPERATURE THIN FILM DEPOSITION AND IN-SITU ANNEALING

(71) Applicant: DSGI Technologies, Inc., San Jose, CA (US)

(72) Inventor: Jeffrey Edward Kowalski, San Jose, CA (US)

(73) Assignee: DSGI Technologies, Inc., San Jose, CA (US)

( * ) Notice: Subject to any disclaimer, the term of this patent is extended or adjusted under 35 U.S.C. 154(b) by 771 days.

(21) Appl. No.: 16/813,175

(22) Filed: Mar. 9, 2020

(65) Prior Publication Data

US 2020/0283905 A1 Sep. 10, 2020

Related U.S. Application Data

(60) Provisional application No. 62/815,495, filed on Mar. 8, 2019.

(51) Int. Cl.
| | | |
|---|---|---|
| *C23C 16/511* | (2006.01) | |
| *C23C 16/458* | (2006.01) | |
| *H01J 37/32* | (2006.01) | |
| *H01L 21/02* | (2006.01) | |
| *H01L 21/285* | (2006.01) | |

(52) U.S. Cl.
CPC ........ *C23C 16/511* (2013.01); *C23C 16/4588* (2013.01); *H01J 37/32192* (2013.01); *H01J 37/32201* (2013.01); *H01J 37/32211* (2013.01); *H01J 37/3222* (2013.01); *H01J 37/32266* (2013.01); *H01J 37/32357* (2013.01); *H01J 37/32715* (2013.01); *H01J 37/32733* (2013.01); *H01J 37/32816* (2013.01); *H01L 21/02247* (2013.01); *H01L 21/02274* (2013.01); *H01L 21/28556* (2013.01); *H01J 2237/3321* (2013.01)

(58) Field of Classification Search
None
See application file for complete search history.

(56) References Cited

U.S. PATENT DOCUMENTS

| | | | | |
|---|---|---|---|---|
| 4,953,498 A | * | 9/1990 | Hashizume | ....... H01J 37/32623 |
| | | | | 118/723 ME |
| 6,152,075 A | * | 11/2000 | Gardner | ................ C23C 16/511 |
| | | | | 118/728 |
| 6,238,933 B1 | | 5/2001 | Sun et al. | |
| 6,439,155 B1 | * | 8/2002 | Kamarehi | ......... H01J 37/32192 |
| | | | | 118/723 MR |

(Continued)

FOREIGN PATENT DOCUMENTS

WO     WO-2009039220 A1 *  3/2009  ........... H01L 21/324

OTHER PUBLICATIONS

International Search Report and Written Opinion for PCT Appln. No. PCT/US2020/021730; Filed Mar. 9, 2020 and all references cited therein.

*Primary Examiner* — Jose I Hernandez-Kenney
(74) *Attorney, Agent, or Firm* — Hovey Williams LLP (57) ABSTRACT

Systems and methods of forming a thin film on substrate includes positioning the substrate in a chamber; generating, via a uniform microwave field generator, a microwave field around the substrate; and guiding radicals into the chamber so that plasma is generated about the substrate to form the thin film on the substrate.

16 Claims, 6 Drawing Sheets

(56) References Cited

U.S. PATENT DOCUMENTS

| | | | |
|---|---|---|---|
| 2007/0286967 A1* | 12/2007 | Ide | H01L 21/02274 257/E21.264 |
| 2010/0210067 A1* | 8/2010 | Butcher | C23C 16/45523 257/E51.024 |
| 2013/0206182 A1* | 8/2013 | Freer | H01L 21/67057 134/98.1 |
| 2016/0227612 A1* | 8/2016 | Kowalski | H05B 6/6411 |
| 2017/0011889 A1* | 1/2017 | Winkler | B08B 7/0035 |
| 2017/0263420 A1* | 9/2017 | Suguro | C23C 16/452 |

* cited by examiner

SYSTEM AND METHOD OF LOW TEMPERATURE THIN FILM DEPOSITION AND IN-SITU ANNEALING

RELATED APPLICATION

This application claims the priority benefit of U.S. Provisional Patent Application Ser. No. 62/815,495 entitled "LOW TEMPERATURE THIN FILM DEPOSITION INSITU ANNEAL METHOD," filed Mar. 8, 2019, the entire disclosure of which is incorporated herein by reference.

BACKGROUND

Deposition of thin layers of film, either by chemical vapor deposition (CVD) or by atomic layer deposition (ALD) such as silicon dioxide, silicon-nitrogen, titanium nitride, tantalum nitride, etc., on a substrate, such as a silicon wafer, is traditionally done at high temperatures, or over 500° C. Smaller semiconductor device structures, such as copper lines, require that the copper diffusion barrier materials stacks containing these films have to be deposited in structures with a higher aspect ratio and at the same time with lower thicknesses. Physical vapor deposition (PVD) process are approaching their limits; thus, current solutions use ALD processes for conformal deposition of such films. The enhanced reactivity of plasma ALD achieves sufficient material quality and the right material properties within the temperature limits of back-end-of-line processing, i.e., less than or equal to 400° C. To accomplish this, current solutions employ remote plasma fields for forming the layer on the substrate in a low-temperature environment. The heating of the substrate, or wafer, is accomplished by placing the wafer on a heated pedestal or chuck.

Remote plasma modules are used to generate the ions needed to facilitate top surface reactions to form a thin film on the substrate, or wafer. However, the plasma often causes damage to the film due to grounding or chucking and when the plasma energy is too high. The damage may include the formation of electronic defects or undesirable changes to the composition or structure of a thin film caused by exposure to a plasma species. Plasma ALD of thin films, even with the high reactivity of plasma, remains a challenging process with respect to obtaining the desired film properties and conformality. Plasma-surface interaction occurs both directly between the plasma and the thin film surfaces but also the chamber walls and heated pedestal and chuck. These surface reactions interact with the plasma and affect the subsequent growth and also cause recombination of the radical ions making them inert. In radical enhanced module designs, ions are produced using complex gases, which require a hydrogen-based precursor, in the gas delivery for lowering the thermal activation energy. The lower thermal activation energy, or energy required to crack or separate the gases, allows deposition at lower temperatures. However, the hydrogen often bonds to the film, leaving voids or dangling bonds. The dangling bonds yield poor electrical characteristics by decreasing mobility, and the voids make the film porous and therefore a poor dielectric.

To improve the quality of the film, current solutions lower the pressure around the substrate during deposition, e.g., below 1 torr. However, this slows the growth rate of the film, which leads to lower productivity. Also, temperature control on the surface of the chuck is important for the process, and it is difficult to control wafer temperature due to only the bottom of the wafer being in contact to the heated pedestal or chuck.

The background discussion is intended to provide information related to the present invention which is not necessarily prior art.

SUMMARY

Embodiments of the present invention solve the above-described problems and other problems by providing systems and methods for depositing thin film on a substrate and performing in-situ annealing of the thin film. A system constructed according to an embodiment of the present invention broadly comprises a chamber, two spaced-apart plates positioned within the chamber, a support element positioned in the chamber, a remote plasma source, a dual stage pressure control system, a uniform microwave field generator, and a microwave choke. The two spaced-apart plates are oriented to form a capacitance effect therebetween. The support element is positioned between the two plates and supports the substrate. The remote plasma source is configured to generate a first microwave field for producing radicals. The dual stage pressure control system is in fluid communication with the remote plasma source and the chamber. The dual stage pressure control system is configured for guiding the radicals from the remote plasma source into the chamber so that the radicals facilitate growing the thin film on the substrate.

The uniform microwave field generator is configured to generate a uniform microwave field in the chamber that anneals the thin film. The microwave choke is connected to the remote plasma source and is configured to isolate the chamber from the first microwave field. Annealing the film via the uniform microwave field causes any hydrogen dipoles bonded to the film to independently react to the uniform microwave field. The reaction heats the hydrogen dipoles so that they detach from the film and are removed. This prevents any subsequent film from forming or growing with hydrogen beneath. Additionally, no grounding or chucking is required to form the thin film, which reduces risk of damage to the substrate. Because the microwave field penetrates the substrate, lower energy plasma is required, which also reduces the risk of damage to the substrate caused by the plasma. Since the field is local, lower temperatures can be achieved to crack higher energy gases, such as nitrogen ($N_2$). This also eliminates the need for more complex gases, such as $NH_3$, which will greatly decrease hydrogen voids and simplify the deposition process as complex gases can be hazardous and require expensive scrubbing. Additional issues with remote plasma chambers are partial gas reactions and redeposition of thin films on chamber walls leading to particle generation and charged ions causing damage to the thin film. Since the microwave field is localized between the two plates positioned in the chamber, there is no interaction with outer chamber walls, thereby minimizing particle generation and thin film damage.

Another embodiment of the invention is a method of forming a thin film on a substrate. The method comprises positioning the substrate in a chamber; generating, via a uniform microwave field generator, a microwave field around the substrate positioned in the chamber; and guiding radicals into the chamber so that plasma is generated about the substrate to form the thin film on the substrate.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Figure 1:
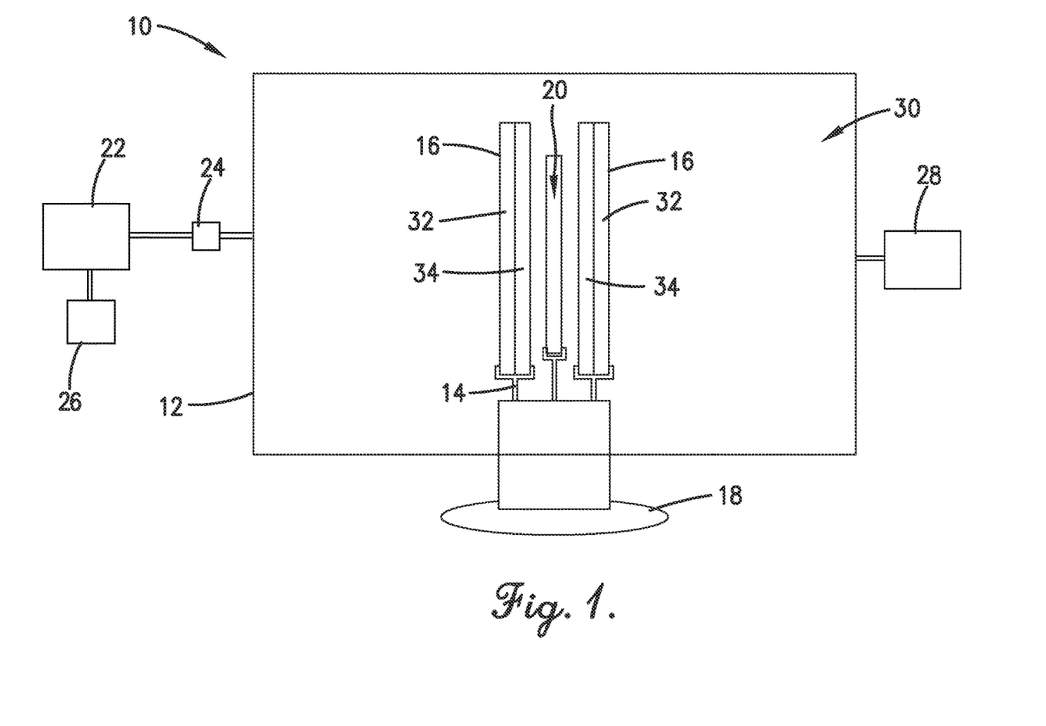
FIG. 1 is a schematic diagram of a thin film deposition and in-situ annealing system constructed in accordance with embodiments of the present invention.
Figure 2:
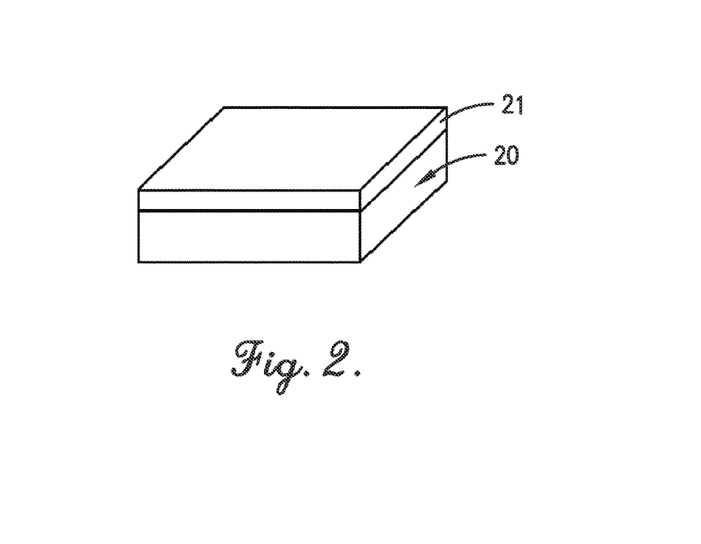
FIG. 2 is a schematic diagram of an example substrate on which a thin film is deposited in the system of FIG. 1.

As illustrated in FIG. 1, a system 10 constructed according to an embodiment of the present invention is configured to deposit a thin film 21 on a substrate 20. The system 10 may comprise a uniform microwave field generator 12, support elements 14, two plates 16 held in spaced relation to each other, a turntable device 18 configured to rotate the two plates 16 and the substrate 20, a remote plasma source 22 configured to generate radicals, a microwave choke 24 attached to the remote plasma source 22, a dual stage pressure control system comprising a first stage 26 for guiding the radicals to the substrate 20, and a second stage 28 for controlling pressure around the substrate 20. Although one set of the parallel plates 16 is described herein, note that many additional plates may be stacked vertically to form a batch reaction (i.e., run multiple target substrates at one time).

The substrate 20 may be a substrate material of any geometry known in the art, such as a semiconductor device and/or a silicon wafer and may have a flat plate or wafer geometry. Additionally or alternatively, the substrate 20 may include a plurality of substrates, such as multiple silicon wafers located between the plates 16 described herein. The substrate 20 may be subject to a deposition and in-situ annealing treatment to form the thin film 21 and simultaneously remove any associated imperfections in the film 21, as described in detail below.

The uniform microwave field generator 12 may comprise a single mode or multi-mode chamber 30, and in some embodiments may include a wave guide port configured for forming a microwave field around and/or between the plates 16 described below. In some embodiments of the invention, the range of microwave frequencies generated by the uniform microwave field generator 12 may be in a range of approximately 900 MHz to 26 GHz. For example, the frequencies generated by the microwave field generator 12 may be approximately 915 MHz, approximately 2.45 GHz, or approximately 5.8 GHz or 24 GHz. However, the uniform microwave field generator 12 may be configured to generate any desired microwave frequencies without departing from the scope of the invention. In some embodiments of the invention, the heat of the film 21 on the substrate 20 generated by the uniform microwave field generator 12 may be in a range of approximately 32° C. to 800° C., and in preferred embodiments in order to maintain a low temperature, a range of approximately 100° C. to 300° C. However, other temperatures may be used without departing from the scope of the invention.

The support elements 14 may be made of an insulator material such as quartz and may be configured for holding and/or supporting the plates 16 and the substrate 20. For example, the support elements 14 may be fixed to a rotating element of the turntable device 18. Alternatively, the support elements 14 may be attached to inner walls of the chamber 30 or other portions of the uniform microwave field generator 12. Furthermore, the support elements 14 may comprise slots, clamps, or other configurations for fixing the plates 16 and the substrate 20 at pre-defined distances from each other. In some embodiments of the invention, the support elements 14 may be selectively adjustable, such that different spacing may be used for different plates 16 and/or different target substrates 20 of different geometries and/or different materials.

The plates 16 may be substantially parallel to each other and may each include a semiconductor layer 32 and a susceptor layer 34. The susceptor layer 34 may be positioned nearest to the substrate 20, with each of the semiconductor layers 32 outward of the two facing susceptor layers 34. However, in some embodiments of the invention, the susceptor layer 34 may be omitted.

The semiconductor layer 32 may be configured to act as a dielectric at lower temperatures and as a metal at higher temperatures. Thus, the semiconductor layer 32 increases in conductivity with increases in temperature, creating a capacitance field to create a capacitance E-field plane between the two semiconductor layers 32. The plates 16 thus cooperatively act as a parallel plate capacitor. However, in some embodiments of the invention, the semiconductor layer 32 may be alternatively replaced with a conductor layer made of metals or other such conductive materials that become conductive when temperature increases, as long as such metals and other materials, when heated as described herein, fall within a conductivity range able to carry a surface current flow.

The susceptor layers 34 may be used to pre-heat the substrate 20 and/or film 21 located therebetween. Specifically, the susceptor layers 34 may be made of material configured to absorb the microwaves and thus cooperatively create a uniform microwave field therebetween. However, in some alternative embodiments of the invention, the susceptor layers 34 may be omitted if the uniform microwave field is otherwise created between and/or around the two semiconductor layers 32.

The plates 16 may have any dimensions and geometries known in the art. In some embodiments of the invention, the plates 16 may be disc-shaped, square, or rectangular. Furthermore, the plates 16 may be thin flat discs having a thickness generally associated to a plate or disc in the solid state industry. The plates 16 may have a spacing of approximately 0.5 mm to approximately 5 mm from each other. The plates 16 may preferably be as thin as possible without being so thin as to sacrifice structural integrity thereof when mounted on the support elements 14 and/or while heated within the uniform microwave field generator 12. In some embodiments of the invention, the plates 16 may be spaced approximately 1 mm to 10 mm apart. However, other spacing distances may be used without departing from the scope of the invention. Specifically, the plates 16 should be spaced close enough together to form a capacitance effect, and therefore close enough for the surface current (i.e., eddy currents) to react, as described herein.

In some embodiments of the invention, the plates 16 may be positioned in any orientation within the uniform microwave field, such as horizontal, vertical, or otherwise. The plates 16 may typically be arranged in parallel orientation relative to each other. However, in some alternative embodiments of the invention, the plates 16 may be positioned in non-parallel relation to each other and/or the substrate 20, as long as the plates 16 are in close enough proximity to form the capacitance effect described herein.

The turntable device 18 may be any mechanism known in the art for creating rotation of items attached thereto. For example, the turntable device 18 may include a rotary motor located outward of the uniform microwave field generator. Furthermore, one of the support elements 14 described above may be attached to a spinning axis of the rotary motor and may extend into the uniform microwave field generator 12 to rotatably support the plates 16 and/or the substrate 20 at desired locations and desired spacing from each other. Within the uniform microwave field, the rotation of the two plates 16 and the substrate 20 may change polarity of microwaves being applied thereto, simulating RF switching of prior art methods. For example, the annealing system 10 may be configured such that the rotation of the substrate 20 may change polarity of microwaves applied thereto every 15°. Other methods of switching the microwave polarity may alternatively be used without departing from the scope of the invention.

The turntable device 18 may be configured for any speed that does not cause detachment of the plates 16 and/or the substrate 20. In some embodiments of the invention, the turntable device 18 may rotate the plates 16 and/or the substrate 20 at a minimum speed of one rotation per minute (rpm) and a maximum speed of 10 rpm. For example, the turntable device 18 may rotate the plates 16 and/or the substrate 20 at a speed of approximately 2 rpm. However, other speeds may be used without departing from the scope of the invention.

The remote plasma source 22 is configured to produce radicals from a gas. The remote plasma source 22 may be configured to generate a microwave field and subject the gas to the microwave field to produce the radicals. The gas may comprise hydrogen, nitrogen, and/or the like. In some embodiments, the gas comprises dinitrogen and/or does not contain hydrogen. The remote plasma source 22 is in fluid communication with the chamber 30 so that the radicals may be guided to the substrate 20 in the chamber 30. The remote plasma source 22 is also connected to the microwave choke 24 to isolate the chamber from the microwaves generated by the remote plasma source 22.

The microwave choke 24 is configured to isolate the microwave field generated by the remote plasma source 22. The microwave choke 24 blocks any microwave from the remote plasma source 22 from entering the chamber 30 to maintain the uniform microwave field generated by the uniform microwave field generator 12. For example, the microwave choke 24 may be attached to an end of conduit in fluid communication with the remote plasma source 22, and an end of a second length of conduit in fluid communication with the chamber 30 may connect to the microwave choke 24. The conduit may guide the radicals from the remote plasma source 22 to the chamber 30, and the microwave choke 24 prevents any microwaves from the remote plasma source 22 from traveling through the conduit to the chamber 30.

The first stage 26 is configured to direct the radicals from the remote plasma source 22 to the chamber 30. The first stage 26 may comprise a pump or motor for pumping the gas into the remote plasma source 22 and the radicals into the chamber 30.

The second stage 28 is configured to control the pressure inside the chamber 30. The second stage 28 is independent from the first stage 26 or operates independently of the first stage 26. In some embodiments, the second stage 28 is configured to maintain the pressure in the chamber 30 above 1 torr. In some embodiments, the second stage 28 is configured to keep the pressure from about 1 torr to about 10 torr. This enables the thin film 21 to be deposited on the substrate 20 at lower temperatures without reducing the growth rate of the film 21.

In use, the substrate 20 may be placed between the plates 16 within the uniform microwave field generator 12. The remote plasma source 22 may generate radicals, and the first stage 26 may pump the radicals into the chamber 30. The uniform microwave field generator 12 may generate a uniform microwave field around the substrate 20 to heat the substrate 20 to a certain temperature while the radicals attach to the surface of the substrate 20. The substrate 20 may be rotated by the turntable device 18 within the uniform microwave field, thus creating a periodic change in polarity of the microwaves applied to the substrate 20. Any impurities in the film 21 will be heated by converting the microwaves to heat and/or creating eddy currents on the surface of the film 21. The eddy currents react by flowing perpendicular to the plates 16, as described below, evenly heating the film 21. The second stage 28 maintains the pressure in the chamber 30 within a predetermined range.

Figure 3:
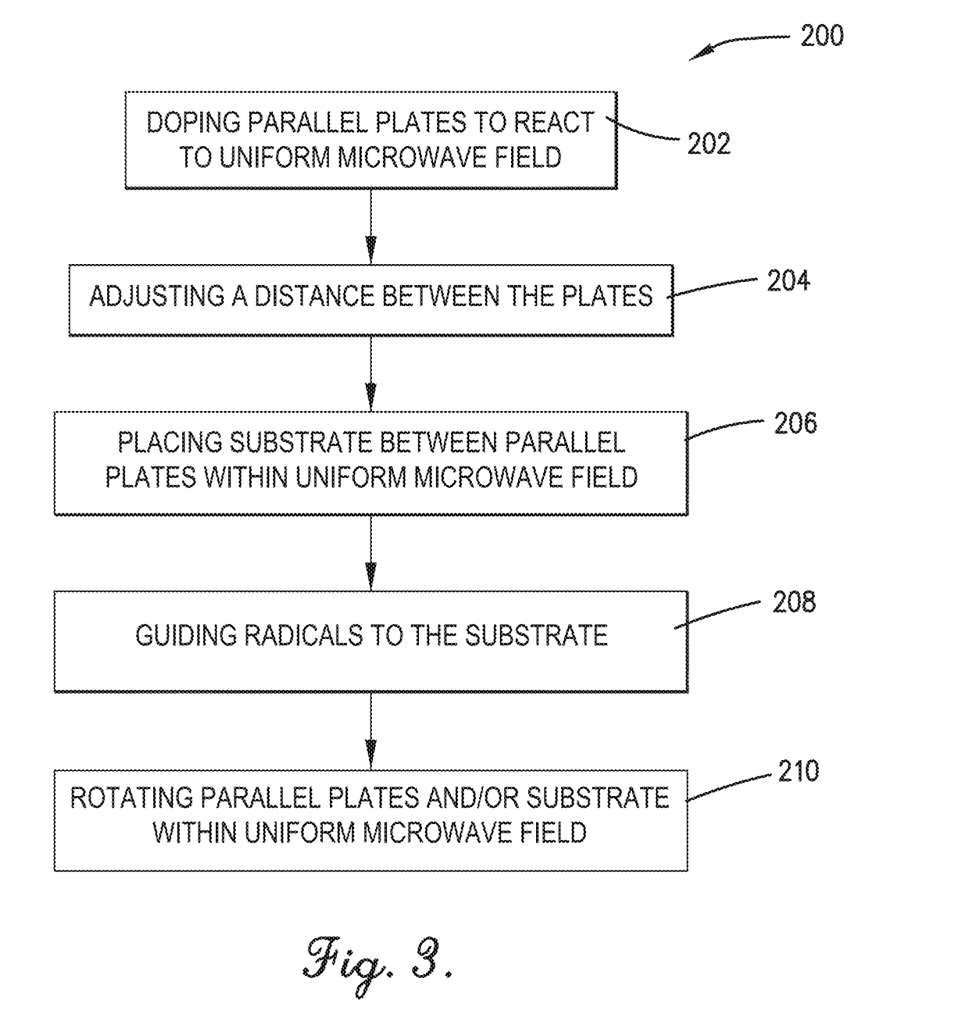
FIG. 3 is a flowchart illustrating steps for forming a thin film on a substrate and in-situ annealing according to an embodiment of the present invention.

FIG. 3 illustrates steps in a method 200 for depositing a thin film on a substrate and annealing the film using a uniform microwave field and parallel plate reaction, in accordance with various embodiments of the present invention. The steps of the method 200 may be performed in the order as shown in FIG. 3, or they may be performed in a different order. Furthermore, some steps may be performed concurrently as opposed to sequentially. In addition, some steps may not be performed. Some of the steps may represent code segments or executable instructions of the computer program or applications described above.

Figure 6:
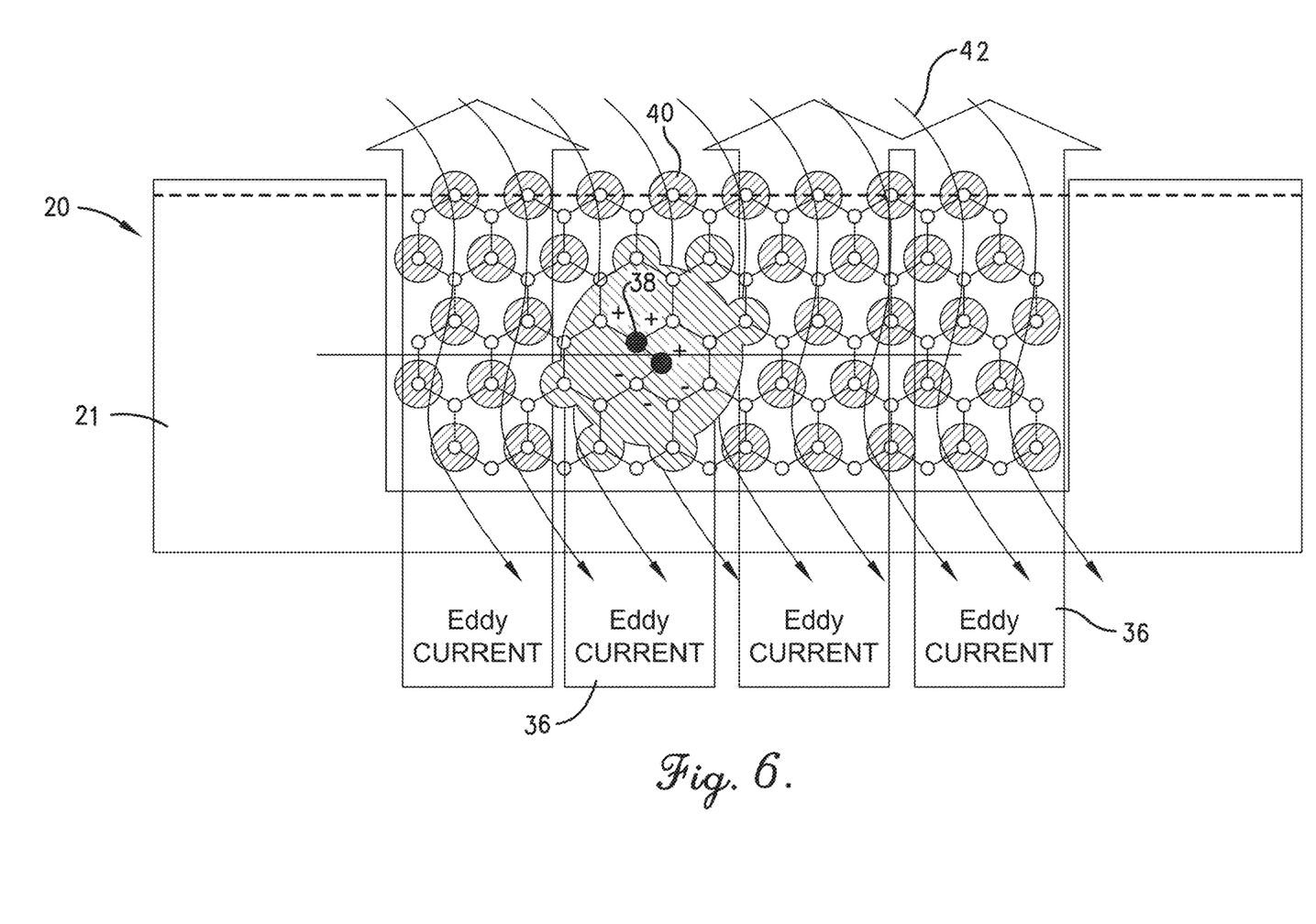
FIG. 6 is a schematic view of the substrate of FIG. 5 undergoing annealing using the method of FIG. 3, with eddy current flowing into the substrate and perpendicular thereto.
Figure 7:
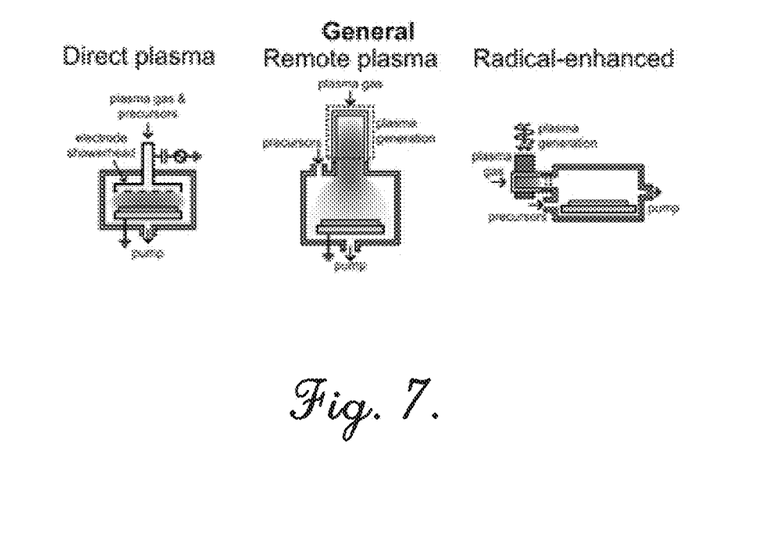

In some embodiments of the invention, the method 200 may include a step of doping the plates 16 to react to the uniform microwave field, as depicted in block 202. For example, intrinsic silicon at room temperature may be primarily microwave transparent and can be doped to react to the microwave E-field. Doping the silicon material may change the conductivity at room temperature, thus allowing microwaves to heat/react the silicone parallel plates at room temperature. In this example, once the silicone plates are heated, the conductivity thereof may decrease based on a band gap of the extrinsic silicon material. This decrease in conductivity may achieve a microwave reaction/penetration, and when the temperature or conductivity is in range, creates a parallel plate E-field within a microwave field. Within the parallel plate E-field described herein, the eddy currents created from a microwave reaction will flow vertical or perpendicular to the substrate 20 (as illustrated in FIG. 6), and not parallel to the surface, as per traditional microwave reactions of metals.

In some embodiments of the invention, the method 200 may optionally include a step of adjusting a distance between the plates 16, as depicted in block 204, based on geometries and materials used for at least one of the plates and the target substrate. For example, as described above, the support elements 14 may be selectively adjustable, such that different spacing may be used for different plates 16 and/or different target substrates 20 of different geometries and/or different materials.

The method 200 may further include a step of placing the substrate 20 between the plates 16 within the uniform microwave field (e.g., multi-mode chamber), as depicted in block 206. As described above, the spacing of the plates 16 may be approximately 0.5 mm to approximately 5 mm or 10 mm from each other. The substrate 20 and the plates 16 may be suspended by and supported by the support elements 14 made of an insulator material such as quartz, as described above.

The method 200 may include a step of exposing a gas to a second microwave field, via a remote plasma source 22, to produce radicals, as depicted in block 208. The gas may comprise hydrogen, nitrogen, and/or the like. In some embodiments, the gas comprises dinitrogen and/or does not contain hydrogen. This step may include delivering the radicals to the substrate 20 via a first stage 26 so that the radicals bond to the substrate 20 to form the film 21.

Figure 4:
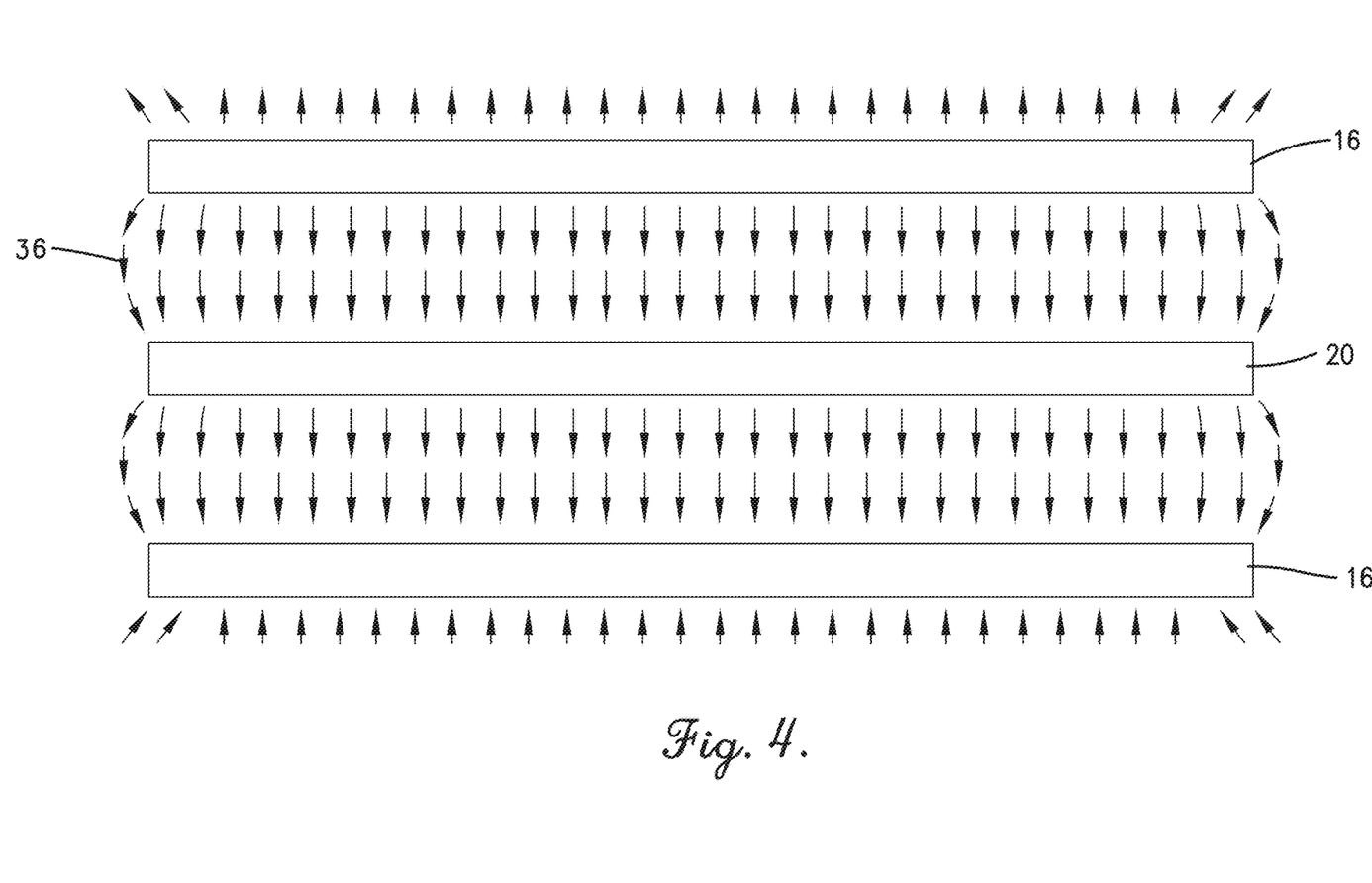
FIG. 4 is a schematic view of a substrate between two plates undergoing annealing using the method of FIG. 3, with eddy current flowing perpendicular to the substrate.

The method 200 may include a step of rotating the plates 16 and/or the substrate 20 within the uniform microwave field using the turntable device 18, as depicted in block 210, thus creating a periodic change in polarity of the microwaves applied to the substrate 20. The substrate 20 will be primarily heated based on its own dielectric properties, converting the microwaves to heat and/or creating eddy currents on the surface of the substrate 20. The rotating plate configuration disclosed herein provides perpendicular flow of eddy currents 36 relative to the substrate 20, as illustrated in FIG. 4, creating even heating thereof and selectively heating defects in the film 21 growing on the targeted substrate 20, as illustrated in FIG. 6.

Figure 5:
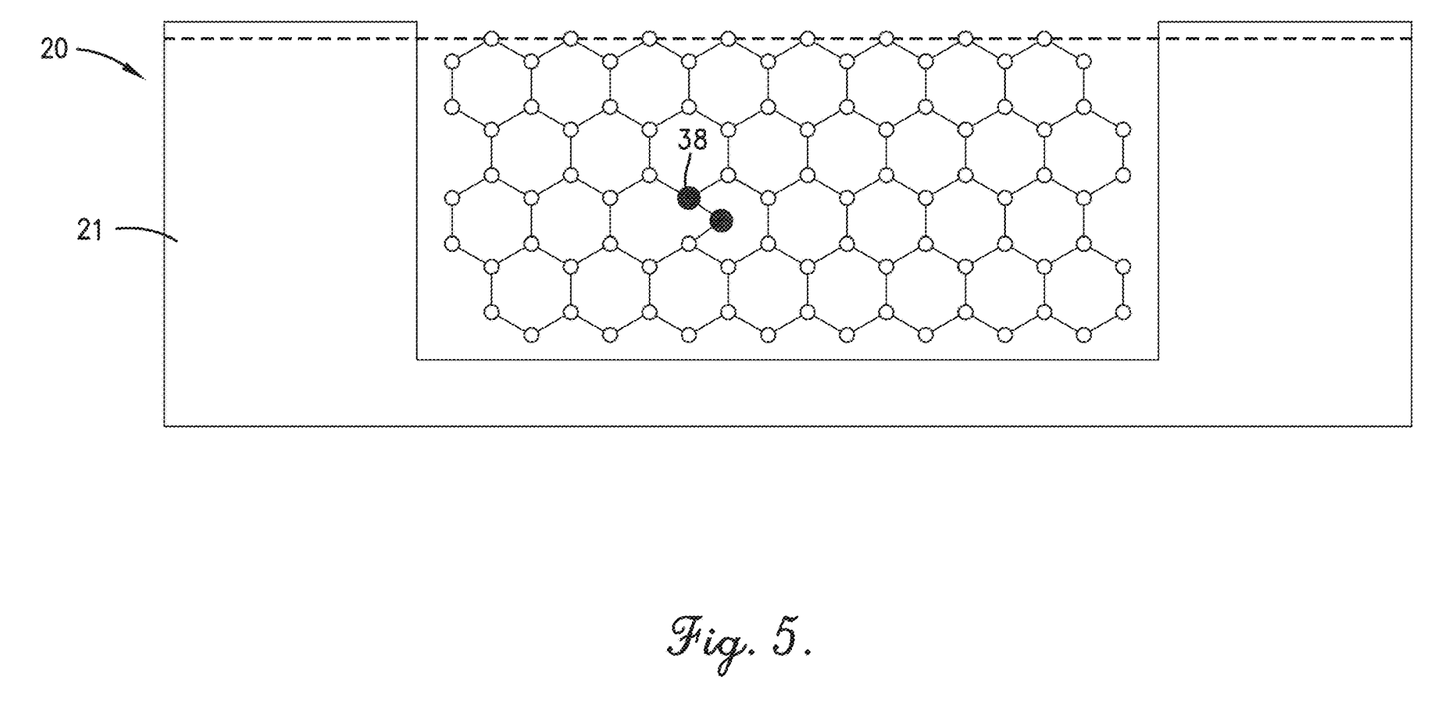
FIG. 5 is a schematic view of a substrate having a defect in the film formed thereon.

Specifically, FIG. 5 schematically illustrates the substrate 20 with the film 21 deposited thereon having a defect 38, also known as an area of mobility reduction. The defect 38 may comprise a hydrogen atom attached to the film 21, which leaves a dangling bond or void. FIG. 6 illustrates the film 21 being heated with the resulting internal heat 40 further volumetrically targeting the defect 38 therein via the eddy currents 36 flowing perpendicularly into the substrate 20. The redirection of the eddy currents 36 allows interfacial polarization to occur in the film 21 at select points where the eddy current 36 is inhibited (e.g. grain defect, impurities, and other defects 38). The polarization of the defect 38 may not cause a substantial reaction in-itself, but the now polarized defect 38 is also subject to the preexisting microwave field (e.g., microwaves 42), allowing the defect 38 to be heated "selectively." This means the temperature of the defect 38 will be much higher as compared to the remainder of the film 21, also referred to herein as the bulk material. This bulk material may act as a heat sink, dissipating the heat within the bulk material of the film 21. In some embodiments, the temperature of the substrate 20 and/or the film 21 may be maintained below 300° C., and in some embodiments, the temperature is kept below 175° C.

The heating method 200 described herein thus completes an activation process and repairs any associated damage to the film 21, without the undesired thermal runaway and arcing of prior art microwave annealing methods and without damage caused by plasma.

Advantageously, instead of trying to manage, minimize, or eliminate the formation of eddy currents, as in prior art microwave methods, the present invention changes the direction in which the resulting eddy currents flow, thereby avoiding uneven heating and effectively repairing defects in the film 21. Annealing the film 21, via the uniform microwave field causes any defects 38, such as hydrogen dipoles, bonded to the film to independently react to the uniform microwave field. The reaction heats the hydrogen dipoles so that they detach from the film 21 and are removed. This prevents any subsequent film 21 from forming or growing with hydrogen beneath. Additionally, no grounding or chucking is required to form the thin film 21, which reduces risk of damage to the substrate 20. Because the microwave field penetrates the substrate 20, lower energy plasma may be used, which also reduces the risk of damage to the substrate 20 caused by the plasma. Since the field is local, lower temperatures can be achieved to crack higher energy gases, such as nitrogen ($N_2$). This also eliminates the need for more complex gases, such as $NH_3$, which will greatly decrease hydrogen voids and simplify the deposition process as complex gases can be hazardous and require expensive scrubbing Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A method of forming a thin film on a substrate, the method comprising:
   positioning the substrate between two plates in a chamber, each of the two plates including a layer of semiconductor material that increases in electrical conductivity with increases in temperature;

rotating the two plates and the substrate about an axis along a diametric line of the substrate;

generating, via a uniform microwave field generator, a first microwave field around the two plates so that an electric field is formed between the two plates with the substrate positioned in the electric field; and guiding radicals into the chamber so that plasma is generated about the substrate to form the thin film on the substrate.

2. The method of claim 1, further comprising maintaining a pressure in the chamber within a predetermined range via a first stage of a dual stage pressure control system.

3. The method of claim 2, wherein the radicals are guided into the chamber via a second stage of the dual stage pressure control system.

4. The method of claim 3, wherein the second stage is isolated from the first stage of the dual stage pressure control system.

5. The method of claim 2, wherein the predetermined range is about 1 torr to about 10 torr.

6. The method of claim 1, further comprising generating the radicals by exposing a gas to a second microwave field.

7. The method of claim 6, wherein the radicals are generated via a remote plasma source.

8. The method of claim 7, wherein the remote plasma source comprises a microwave choke configured to isolate the chamber from the second microwave field.

9. The method of claim 6, wherein the gas comprises hydrogen and the first microwave field heats and removes hydrogen dipoles from the thin film.

10. The method of claim 6, wherein the gas comprises dinitrogen.

11. The method of claim 1, further comprising maintaining the substrate at a temperature less than 175° C.

12. The method of claim 1, wherein the substrate comprises a plurality of silicon wafers.

13. A method of forming a thin film on a substrate, the method comprising:

positioning the substrate between two plates in a chamber, each of the two plates including a layer of semiconductor material that is electrically conductive above a temperature;

rotating the two plates and the substrate about an axis along a diametric line of the substrate;

generating, via a uniform microwave field generator, a first microwave field around the substrate to heat the substrate to a temperature less than 175° C. and to induce an electric field between the two plates;

exposing a gas to a second microwave field, via a remote plasma source comprising a microwave choke configured to isolate the chamber from the second microwave field, to generate radicals;

maintaining a pressure in the chamber within a predetermined range via a first stage of a dual stage pressure control system; and guiding the radicals, via a second stage of the dual stage pressure control system isolated from the first stage, into the chamber to form the thin film on the substrate while the first microwave field selectively heats hydrogen dipoles, thereby removing the hydrogen dipoles from the thin film.

14. The method of claim 13, wherein the gas comprises dinitrogen.

15. The method of claim 13, wherein the gas does not comprise hydrogen.

16. The method of claim 13, wherein the predetermined range of the pressure inside the chamber is about 1 torr to about 10 torr.

* * * * *